United States Patent
Tomita et al.

(10) Patent No.: US 10,629,446 B2
(45) Date of Patent: Apr. 21, 2020

(54) SUBSTRATE TREATMENT METHOD AND SUBSTRATE TREATMENT APPARATUS

(71) Applicant: TOKYO ELECTRON LIMITED, Tokyo (JP)

(72) Inventors: Masahiko Tomita, Nirasaki (JP); Hiroyuki Takahashi, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/772,546

(22) PCT Filed: Oct. 14, 2016

(86) PCT No.: PCT/JP2016/081190
§ 371 (c)(1),
(2) Date: May 1, 2018

(87) PCT Pub. No.: WO2017/077876
PCT Pub. Date: May 11, 2017

(65) Prior Publication Data
US 2018/0330962 A1    Nov. 15, 2018

(30) Foreign Application Priority Data
Nov. 5, 2015 (JP) ................. 2015-217701

(51) Int. Cl.
*H01L 21/3065* (2006.01)
*H01L 21/02* (2006.01)
(Continued)

(52) U.S. Cl.
CPC .... *H01L 21/3065* (2013.01); *H01L 21/02049* (2013.01); *H01L 21/0337* (2013.01);
(Continued)

(58) Field of Classification Search
None
See application file for complete search history.

(56) References Cited

U.S. PATENT DOCUMENTS 7,416,989 B1 * 8/2008 Liu ................... H01L 21/02063
438/706
2013/0130499 A1 * 5/2013 Ugajin .............. H01L 21/31116
438/689

FOREIGN PATENT DOCUMENTS

JP  2007-266455 A  10/2007
JP  2008-160000 A  7/2008
(Continued)

OTHER PUBLICATIONS

International Search Report dated Dec. 12, 2016 in corresponding International Application No. PCT/JP2016/081190 dated Dec. 27, 2016.

*Primary Examiner* — Jiong-Ping Lu
(74) *Attorney, Agent, or Firm* — Nath, Goldberg & Meyer; Jerald L. Meyer (57) ABSTRACT

A substrate treatment method capable of obtaining a flat processing target film. Molecules of an HF gas are adsorbed onto a corner $SiO_2$ layer remaining in a corner portion of a groove of a wafer subjected to an oxide film removal process. An excess HF gas is discharged. An $NH_3$ gas is supplied toward the corner $SiO_2$ layer onto which the molecules of the HF gas are adsorbed. AFS is formed by reacting the corner $SiO_2$ layer, the HF gas and the $NH_3$ gas with each other. The AFS is sublimated and removed.

5 Claims, 7 Drawing Sheets

(51) Int. Cl.
*H01L 21/302* (2006.01)
*H01L 21/3213* (2006.01)
*H01L 21/67* (2006.01)
*H01L 21/033* (2006.01)
*H01L 21/311* (2006.01)
*H01L 21/687* (2006.01)

(52) U.S. Cl.
CPC ...... *H01L 21/302* (2013.01); *H01L 21/31116* (2013.01); *H01L 21/32135* (2013.01); *H01L 21/67207* (2013.01); *H01L 21/68707* (2013.01)

(56) References Cited

FOREIGN PATENT DOCUMENTS

| | | |
|---|---|---|
| JP | 2010-245512 A | 10/2010 |
| WO | 2012/018010 A1 | 2/2012 |

\* cited by examiner

SUBSTRATE TREATMENT METHOD AND SUBSTRATE TREATMENT APPARATUS

This is a National Phase Application filed under 35 U.S.C. 371 as a national stage of PCT/JP2016/081190, filed Oct. 14, 2016, an application claiming the benefit of Japanese Patent Application No. 2015-217701, filed Nov. 5, 2015, the content of each of which is hereby incorporated by reference in its entirety.

TECHNICAL FIELD

The present disclosure relates to a substrate treatment method and a substrate treatment apparatus which make use of a semiconductor wafer.

BACKGROUND

In a method of manufacturing an electronic device using a semiconductor wafer (hereinafter simply referred to as a "wafer"), for example, a film forming step of forming a conductive film or an insulating film on a surface of the wafer, a lithography step of forming a photoresist layer of a prescribed pattern on the conductive film or the insulating film thus formed, an etching step of forming the conductive film into a gate electrode by plasma generated from a processing gas or forming a wiring hole or a contact hole in the insulating film, using the photoresist layer as a mask, or the like are executed.

Figure 7A:
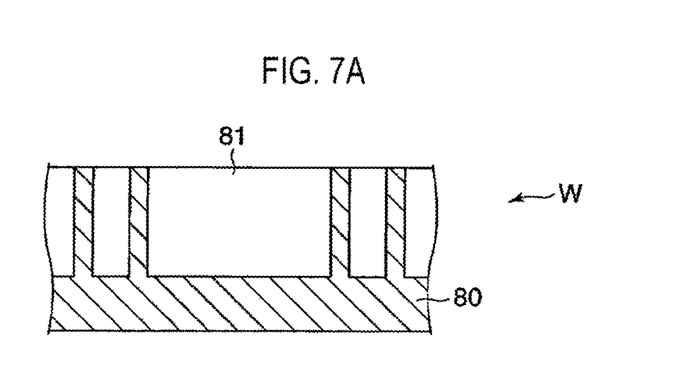
FIGS. 7A to 7C are process views for explaining a conventional oxide film removal process.

For example, in a certain method of manufacturing an electronic device, a groove is formed in a predetermined pattern on a polysilicon film 80 formed on the surface of a wafer W, and subsequently, a $SiO_2$ layer 81 which is an oxide film for filling the groove is formed (FIG. 7A). Then, the $SiO_2$ layer 81 thus formed is partially removed by etching or the like so as to have a predetermined thickness.

At this time, as a method of removing the $SiO_2$ layer 81, a substrate treatment method is known in which a wafer W is subjected to a COR (Chemical Oxide Removal) process and a PHT (Post Heat Treatment) process. The COR process is a process of chemically reacting the $SiO_2$ layer 81 with gas molecules to generate a reaction product. The PHT process is a process of heating the wafer W subjected to the COR process and removing the reaction product produced in the COR process from the wafer W by sublimation.

As a substrate treatment apparatus for executing the substrate treatment method which performs the COR process and the PHT process, a substrate treatment apparatus has been used that includes a chemical reaction processing chamber (COR process chamber) and a thermal processing chamber (PHT process chamber) connected to the chemical reaction processing chamber (see, for example, Patent Document 1). In addition, a substrate treatment apparatus has been used that performs, in a common processing chamber, a COR process on the wafer W at a low temperature and subsequently, performs a PHT process by heating a wafer W to a predetermined temperature (see, for example, Patent Document 2). In any of the substrate treatment apparatuses, a hydrogen fluoride (HF) gas and an ammonia ($NH_3$) gas are used in the COR process, and a reaction product is produced from the $SiO_2$ layer 81.

PRIOR ART DOCUMENTS

Patent Documents

Patent Document 1: Japanese laid-open publication No. 2008-160000

Patent Document 2: Japanese laid-open publication No. 2007-266455

Figure 7B:
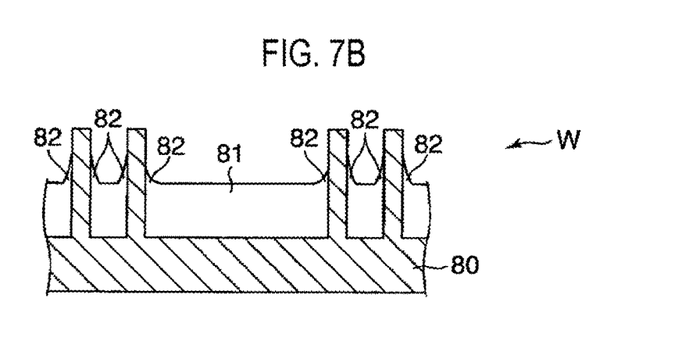

However, the HF gas used in the COR process has high reactivity. Upon making contact with an $NH_3$ gas or the $SiO_2$ layer 81, the HF gas immediately undergoes a chemical reaction to generate a reaction product. That is to say, the HF gas undergoes a chemical reaction with the $NH_3$ gas or the $SiO_2$ layer 81 before reaching a place to which the HF gas hardly diffuses, for example, the corner of a groove. As such, the $SiO_2$ layer at the corner of the groove (hereinafter referred to as "corner $SiO_2$ layer") 82 is not modified into a reaction product and cannot be sublimated in the subsequent PHT process. That is to say, even if the substrate treatment method including the COR process and the PHT process is performed, the corner $SiO_2$ layer 82 remains (FIG. 7B), which makes it difficult to obtain a flat $SiO_2$ layer 81.

Figure 7C:
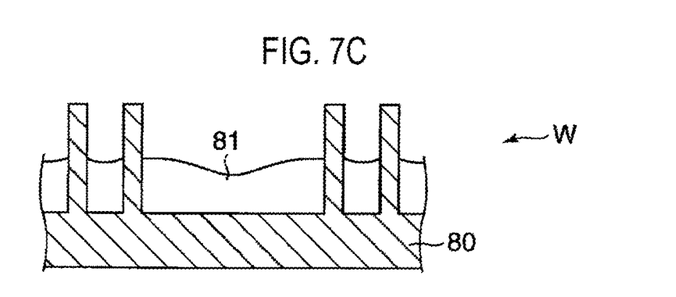

Therefore, it is conceivable that the COR process is performed for a long period of time so that the HF gas can diffuse to the corner of the groove, and the corner $SiO_2$ layer 82 is forcibly modified into a reaction product. In this case, however, the $SiO_2$ layer 81 other than the corner $SiO_2$ layer 82 may be modified into a reaction product more than necessary. This makes it difficult to obtain a flat $SiO_2$ layer 81 (FIG. 7C).

The present disclosure provides some embodiments of a substrate treatment method and a substrate treatment apparatus capable of obtaining a flat processing target film.

SUMMARY

According to one embodiment of the present disclosure, there is provided substrate treatment method for at least partially removing a processing target film formed on a surface of a substrate, including: a first etching step of subjecting the processing target film to a first etching; and a second etching step of subjecting the processing target film subjected to the first etching to a second etching, wherein the second etching step includes: an adsorption step of causing molecules of a first processing gas to be adsorbed onto the processing target film subjected to the first etching; a production step of producing a product by supplying a second processing gas toward the processing target film onto which the molecules of the first processing gas are adsorbed, and allowing the processing target film, the first processing gas and the second processing gas to react with each other; and a removal step of sublimating and removing the product.

According to another embodiment of the present disclosure, there is provided a substrate treatment apparatus, including: a mounting table configured to mount a substrate having a processing target film formed thereon; a processing chamber configured to accommodate the mounting table; a processing gas supply part configured to supply a first processing gas and a second processing gas into the processing chamber; and a control part configured to control an operation of the processing gas supply part, wherein, if the substrate is mounted on the mounting table, the control part executes a first etching step of subjecting the processing target film to a first etching and a second etching step of subjecting the processing target film subjected to the first etching to a second etching, and the control part controls the operation of the processing gas supply part in the second etching step so that molecules of the first processing gas are adsorbed onto the processing target film subjected to the first etching, the second processing gas is supplied toward the processing target film onto which the molecules of the first processing gas are adsorbed, and the processing target film, the first processing gas and the second processing gas react with each other to produce a product.

According to the present disclosure, molecules of a first processing gas are adsorbed onto a processing target film subjected to a first etching, a second processing gas is supplied toward the processing target film onto which the molecules of the first processing gas are absorbed, the first processing gas and the second processing gas react with each other to produce a product, and the product thus produced is sublimated and removed. Since non-flat portions of the processing target film remaining after the first etching are sparse in structure by the first etching, the surface area of the non-flat portions is increased and a large amount of molecules of the first processing gas are adsorbed onto the non-flat portions. Accordingly, when the second processing gas is supplied, the non-flat portions of the processing target film reacts with the second processing gas more positively than other portions of the processing target film, so that the majority of non-flat portions of the processing target film are modified into a product. As a result, by subliming the product, it is possible to remove the majority of non-flat portions. Consequently, it is possible to obtain a flat processing target film.

DETAILED DESCRIPTION

Embodiments of the present disclosure will now be described in detail with reference to the accompanying drawings.

Figure 1:
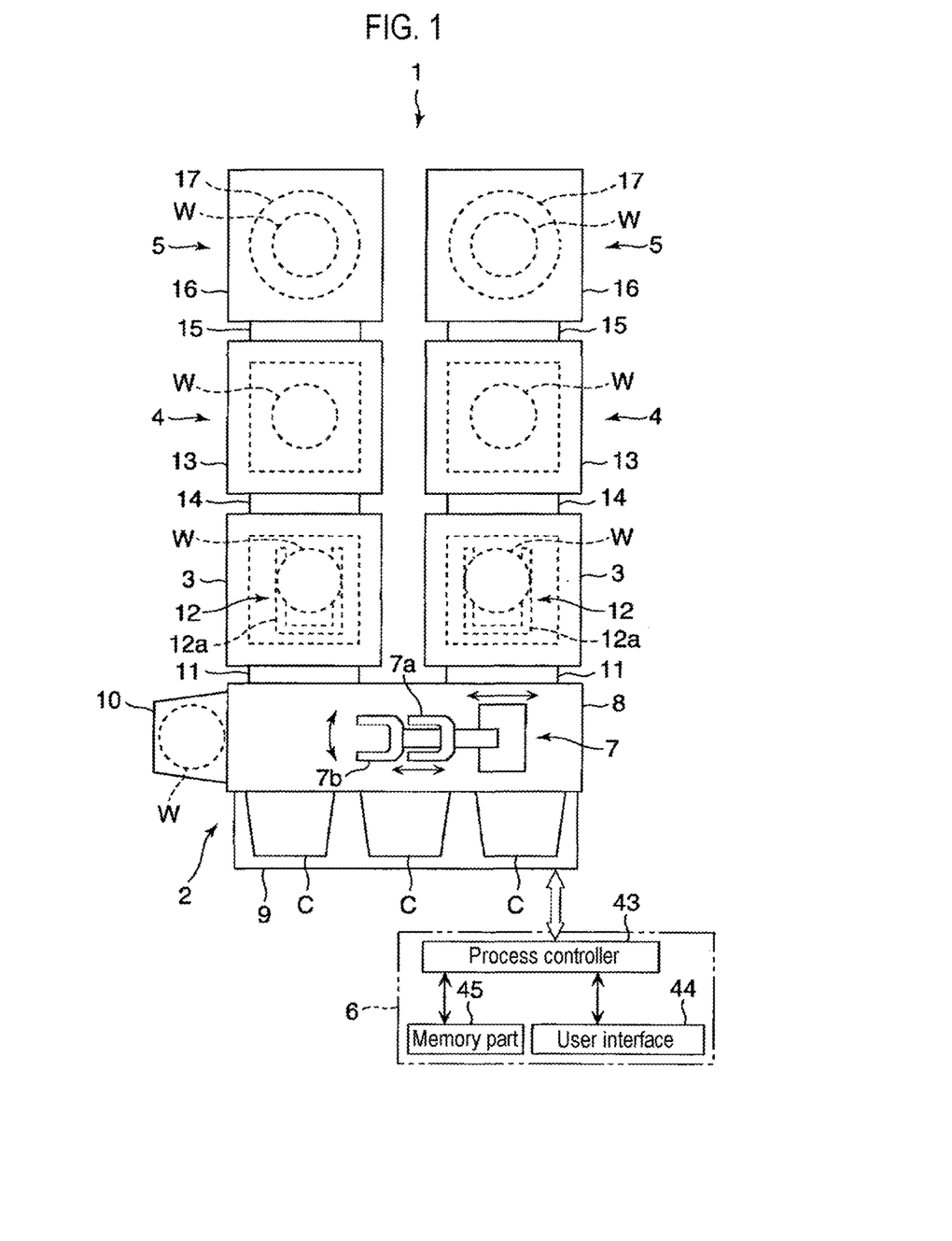
FIG. 1 is a plan view schematically showing a configuration of a substrate processing system including a substrate treatment apparatus according to an embodiment of the present disclosure.

FIG. 1 is a plan view schematically showing a configuration of a substrate processing system including a substrate treatment apparatus according to an embodiment of the present disclosure.

Referring to FIG. 1, a substrate processing system 1 includes a loading/unloading part 2 for loading and unloading a wafer W as a substrate, two load lock chambers (L/L) 3 provided adjacent to the loading/unloading part 2, heat treatment apparatuses 4 provided adjacent to the respective load lock chambers 3 and configured to perform a heat treatment on the wafer W, etching apparatuses 5 provided adjacent to the respective heat treatment apparatuses 4 and configured to perform an oxide film removal process (a COR process and a PHT process to be described later) (a first etching step), which is an example of an etching process, on the wafer W, and a control part 6.

The loading/unloading part 2 includes a transfer chamber (L/M) 8 in which a first wafer transfer mechanism 7 for transferring the wafer W is provided. The first wafer transfer mechanism 7 includes two transfer arms 7a and 7b for holding the wafer W in a substantially horizontal posture. A mounting stand 9 is provided at a side portion in the longitudinal direction of the transfer chamber 8. For example, three carriers C capable of accommodating a plurality of wafers W arranged side by side may be mounted on and connected to the mounting stand 9. An orienter 10 for rotating the wafer W, optically obtaining an eccentric amount of the wafer W and positioning the wafer W is installed adjacent to the transfer chamber 8.

In the loading/unloading part 2, the wafer W is held by each of the transfer arms 7a and 7b and is linearly moved in a substantially horizontal plane or moved up and down by the first wafer transfer mechanism 7, whereby the wafer W is transferred to a desired position. By extending and retracting each of the transfer arms 7a and 7b, it is possible to load and unload the wafer W to and from each of the carriers C on the mounting stand 9, the orienter 10 and each of the load lock chambers 3.

Each of the load lock chambers 3 is connected to the transfer chamber 8 with gate valve 11s interposed between the load lock chambers 3 and the transfer chamber 8. A second wafer transfer mechanism 12 for transferring the wafer W is provided in each of the load lock chambers 3. In addition, each of the load lock chambers 3 is configured to be evacuated to a predetermined degree of vacuum.

The second wafer transfer mechanism 12 includes an articulated arm (not shown) and further includes a pick 12a provided at the tip of the articulated arm to hold the wafer W in a substantially horizontal posture. In the second wafer transfer mechanism 12, the pick 12a is positioned in the load lock chamber 3 by contracting the articulated arm, while the pick 12a reaches the respective heat treatment apparatus 4 by extending the articulated arm. Further, the pick 12a can reach the respective etching apparatus 5 by further extending the articulated arm. That is to say, the second wafer transfer mechanism 12 can transfer the wafer W between the load lock chamber 3, the heat treatment apparatus 4 and the etching apparatus 5.

Each of the heat treatment apparatus 4 includes a vacuumable chamber 13. A mounting table (not shown) for mounting the wafer W thereon is provided inside the chamber 13. A heater (not shown) is embedded in the mounting table. In the heat treatment apparatus 4, the wafer W subjected to the oxide film removal process in the etching apparatus 5 is mounted on the mounting table, and a heat treatment of heating the wafer W with the heater to vaporize the residue remaining on the wafer W is performed. A loading/unloading port (not shown) for transferring the wafer W to and from the load lock chamber 3 is formed at the side of the load lock chamber 3 in the chamber 13. This loading/unloading port may be opened and closed by a gate valve 14. A loading/unloading port (not shown) for transferring the wafer W to and from the etching apparatus 5 is formed at the side of the etching apparatus 5 in the chamber 13. This loading/unloading port may be opened and closed by a gate valve 15.

A gas supply path (not shown) is connected to an upper portion of a side wall of the chamber 13. The gas supply path is connected to a gas supply unit (not shown). An exhaust path (not shown) is connected to a bottom wall of the chamber 13. The exhaust path is connected to a vacuum pump (not shown). A flow rate control valve is provided in the gas supply path extending from the gas supply unit to the chamber 13. A pressure regulation valve is provided in the exhaust path. By adjusting these valves, the inside of the chamber 13 may be kept at a predetermined pressure to perform a heat treatment.

Figure 2:
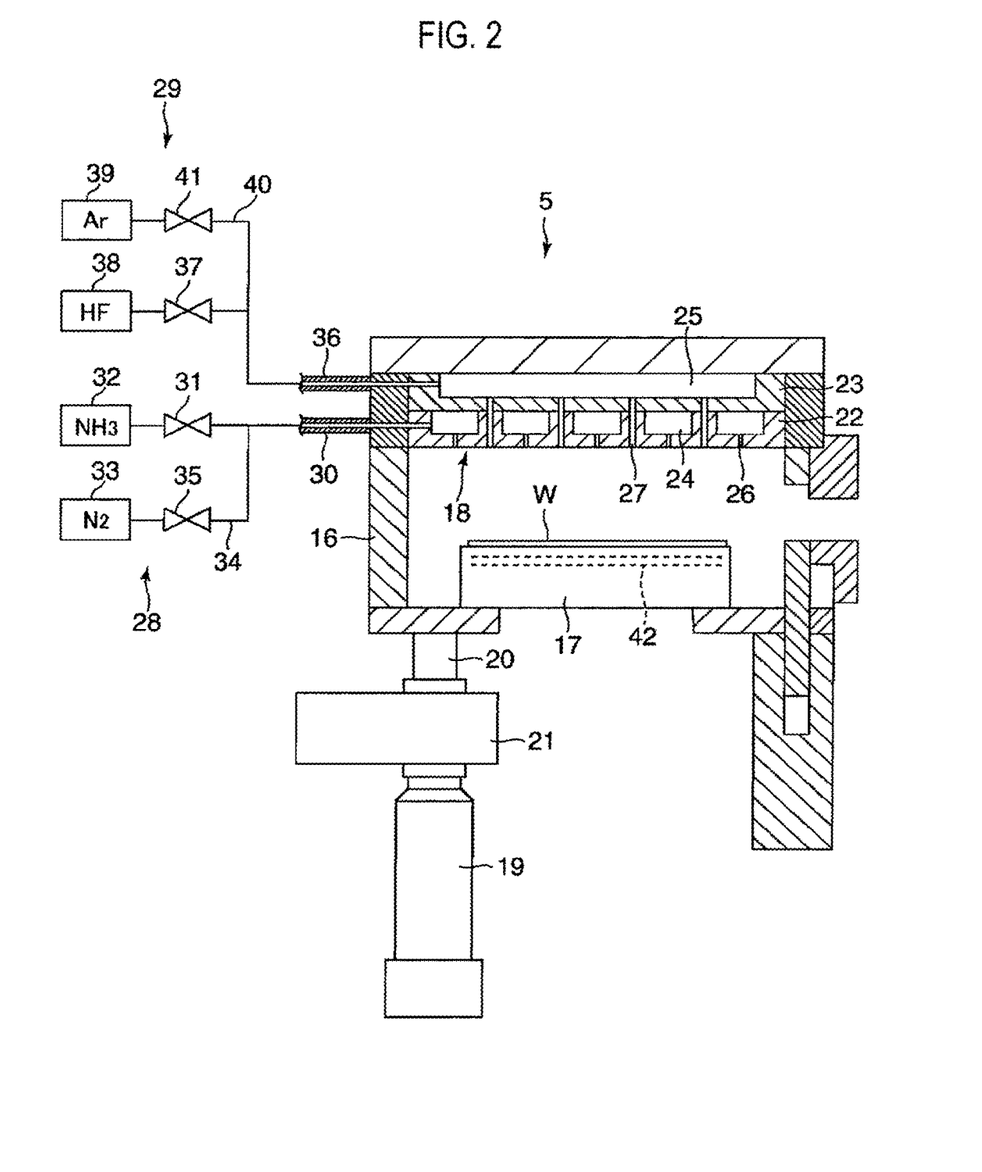
FIG. 2 is a sectional view schematically showing a configuration of an etching apparatus shown in FIG. 1.

FIG. 2 is a sectional view schematically showing a configuration of the etching apparatus 5 shown in FIG. 1.

Referring to FIG. 2, the etching apparatus 5 includes a chamber 16 which is a processing chamber container, a mounting table 17 disposed inside the chamber 16 and configured to mount a wafer W thereon, and a shower head 18 arranged above the chamber 16 so as to face the mounting table 17. In addition, the etching apparatus 5 includes a TMP (Turbo Molecular Pump) 19 as an exhaust unit for exhausting a gas existing inside the chamber 16, and an APC (Adaptive Pressure Control) valve 21 as a variable valve disposed between the TMP 19 and the exhaust duct 20 connected to the chamber 16, and configured to control an internal pressure of the chamber 16.

The shower head 18 has a two-layered structure composed of a plate-like lower layer portion 22 and a plate-like upper layer portion 23. The lower layer portion 22 and the upper layer portion 23 include a first buffer chamber 24 and a second buffer chamber 25, respectively. The first buffer chamber 24 and the second buffer chamber 25 communicate with the inside of the chamber 16 via gas vents 26 and 27, respectively. That is to say, the shower head 18 includes two plate-like bodies (the lower layer portion 22 and the upper layer portion 23) stacked in a hierarchical structure, which have internal passages for introducing the gas supplied to the first buffer chamber 24 and the second buffer chamber 25 into the chamber 16.

The chamber 16 is connected to a gas supply unit that includes an ammonia ($NH_3$) gas supply system 28 (processing gas supply part) and a hydrogen fluoride (HF) gas supply system 29 (processing gas supply part). The lower layer portion 22 of the shower head 18 is connected to the $NH_3$ gas supply system 28. The $NH_3$ gas supply system 28 includes an $NH_3$ gas supply pipe 30 communicating with the first buffer chamber 24 of the lower layer portion 22, an $NH_3$ gas valve 31 disposed in the $NH_3$ gas supply pipe 30, and an $NH_3$ gas supply part 32 connected to the $NH_3$ gas supply pipe 30. The $NH_3$ gas supply part 32 supplies an $NH_3$ gas to the first buffer chamber 24 via the $NH_3$ gas supply pipe 30 and further adjusts a flow rate of the $NH_3$ gas to be supplied. The $NH_3$ gas valve 31 freely performs disconnection/connection of the $NH_3$ gas supply pipe 30.

The $NH_3$ gas supply system 28 includes a nitrogen ($N_2$) gas supply part 33, an $N_2$ gas supply pipe 34 connected to the $N_2$ gas supply part 33, and an $N_2$ gas valve 35 disposed in the $N_2$ gas supply pipe 34. The $N_2$ gas supply pipe 34 is connected to the $NH_3$ gas supply pipe 30 between the first buffer chamber 24 and the $NH_3$ gas valve 31. The $N_2$ gas supply part 33 supplies an $N_2$ gas to the first buffer chamber 24 via the $N_2$ gas supply pipe 34 and the $NH_3$ gas supply pipe 30. Further, the $N_2$ gas supply part 33 adjusts a flow rate of the $N_2$ gas to be supplied. The $N_2$ gas valve 35 freely performs disconnection/connection of the $N_2$ gas supply pipe 34. In the $NH_3$ gas supply system 28, by switching the opening and closing of the $NH_3$ gas valve 31 and the $N_2$ gas valve 35, it is possible to selectively switch the type of gas to be supplied into the first buffer chamber 24, ultimately the chamber 16.

The upper layer portion 23 of the shower head 18 is connected to the HF gas supply system 29. The HF gas supply system 29 includes an HF gas supply pipe 36 communicating with the second buffer chamber 25 of the upper layer portion 23, an HF gas valve 37 disposed in the HF gas supply pipe 36, and an HF gas supply part 38 connected to the HF gas supply pipe 36. The HF gas supply part 38 supplies an HF gas to the second buffer chamber 25 via the HF gas supply pipe 36 and further adjusts a flow rate of the HF gas to be supplied. The HF gas valve 37 freely performs disconnection/connection of the HF gas supply pipe 36. The upper layer portion 23 of the shower head 18 incorporates a heater (not shown) therein. The HF gas in the second buffer chamber 25 may be heated by the heater.

The HF gas supply system 29 includes an argon (Ar) gas supply part 39, an Ar gas supply pipe 40 connected to the Ar gas supply part 39, and an Ar gas valve 41 disposed in the Ar gas supply pipe 40. The Ar gas supply pipe 40 is connected to the HF gas supply pipe 36 between the second buffer chamber 25 and the HF gas valve 37. The Ar gas supply part 39 supplies an Ar gas to the second buffer chamber 25 via the Ar gas supply pipe 40 and the HF gas supply pipe 36. Further, the Ar gas supply part 39 adjusts a flow rate of the Ar gas to be supplied. The Ar gas valve 41 freely performs disconnection/connection of the Ar gas supply pipe 40.

In the etching apparatus 5, the volumetric flow rate ratio of the $NH_3$ gas and the HF gas supplied from the shower head 18 into the chamber 16 is adjusted in cooperation between the $NH_3$ gas supply part 32 of the $NH_3$ gas supply system 28 and the HF gas supply part 38 of the HF gas supply system 29. Further, the etching apparatus 5 is designed (to be described later) have a post-mix design) so that the $NH_3$ gas and the HF gas are initially mixed inside the chamber 16. This prevents the $NH_3$ gas and the HF gas from being mixed and reacted with each other before being introduced into the chamber 16. Furthermore, in the etching apparatus 5, a heater (not shown) is built in the side wall of the chamber 16. This makes it possible to prevent a decrease in the atmosphere temperature in the chamber 16 and, ultimately, to improve the reproducibility of the oxide film removal process. By controlling the temperature of the side wall, it is possible to suppress a sublimated reaction product or a vaporized byproduct from re-adhering to the inner surface of the side wall in the chamber 16 during the oxide film removal process.

The mounting table 17 has a substantially circular shape in a plan view and is fixed to the bottom portion of the chamber 16. A temperature adjuster 42 (temperature adjusting part) for adjusting a temperature of the mounting table 17 is provided inside the mounting table 17. The temperature adjuster 42 is provided with a conduit through which a temperature control medium such as, for example, water or the like circulates. The mounting table 17 performs heat exchange with the temperature control medium flowing through the conduit so that the temperature of the mounting table 17 is adjusted, whereby the temperature of the wafer W mounted on the mounting table 17 is controlled. In addition, the mounting table 17 includes lift pins (not shown) that raises and lowers the wafer W on the upper surface of the mounting table 17 in order to transfer the wafer W between the mounting table 17 and the second wafer transfer mechanism 12. Details of the oxide film removal process executed by the etching apparatus 5 will be described later.

Referring back to FIG. 1, the control part 6 includes a process controller 43 provided with a microprocessor (computer) for controlling respective components of the substrate processing system 1. A user interface 44 including a keyboard (not shown) through which an operator performs an input operation of a command or the like to manage the substrate processing system 1, a display for visually displaying the operating status of the substrate processing system 1 and the like is connected to the process controller 43. Furthermore, a memory part 45 that stores a control program for realizing the supply of the processing gas used in various processes executed by the substrate processing system 1, for example, the oxide film removal process performed by the etching apparatus 5, and the exhaust of the interior of the chamber 16 under the control of the process controller 43, a process recipe which is a control program for causing the respective components of the substrate processing system 1 to execute a predetermined process according to processing conditions, various databases, and the like is connected to the process controller 43. The process recipe and the like are stored in a storage medium (not shown) in the memory part 45. If necessary, a desired process is performed in the substrate processing system 1 under the control of the process controller 43 by calling an arbitrary process recipe from the memory part 45 and causing the process controller 43 to execute the process recipe.

In the present embodiment, for example, first, a wafer W having an SiO₂ layer (a processing target film) to be subjected to an oxide film removal process in the etching apparatus 5 is accommodated in the carrier C and is transferred to the substrate processing system 1. Thereafter, in the substrate processing system 1, one wafer W is transferred from the carrier C of the loading/unloading part 2 to the load lock chamber 3 by one of the transfer arms 7a and 7b of the first wafer transfer mechanism 7 in a state in which the gate valve 11 disposed at the atmospheric side is opened, and is delivered to the pick 12a of the second wafer transfer mechanism 12 inside the load lock chamber 3. Thereafter, the gate valve 11 disposed at the atmospheric side is closed to evacuate the interior of the load lock chamber 3. Then, the gate valve 15 is opened, and the pick 12a is moved to the etching apparatus 5 to transfer the wafer W to the etching apparatus 5.

Thereafter, the pick 12a is returned to the load lock chamber 3 and the gate valve 15 is closed to perform the oxide film removal process (to be described later) in the etching apparatus 5. After the oxide film removal process is completed, the gate valves 14 and 15 are opened. The wafer W subjected to the oxide film removal process is transferred to the heat treatment apparatus 4 by the pick 12a of the second wafer transfer mechanism 12 and is mounted on the mounting table provided in the heat treatment apparatus 4. Then, while introducing an N₂ gas or the like into the chamber 13, the wafer W mounted on the mounting table is heated by the heater to heat and remove the residue of the wafer W and the like.

Subsequently, upon completion of the heat treatment in the heat treatment apparatus 4, the gate valve 14 is opened and the wafer W mounted on the mounting table of the heat treatment apparatus 4 is withdrawn and moved to the load lock chamber 3 by the pick 12a of the second wafer transfer mechanism 12. Thereafter, the wafer W is returned to the carrier C by one of the transfer arms 7a and 7b of the first wafer transfer mechanism 7. In this manner, the processing for one sheet of wafer is completed.

In the substrate processing system 1, the heat treatment apparatus 4 is not essential. In the case where the heat treatment apparatus 4 is not provided, the wafer W subjected to the oxide film removal process may be moved into the load lock chamber 3 by the pick 12a of the second wafer transfer mechanism 12 and may be returned to the carrier C by one of the transfer arms 7a and 7b of the first wafer transfer mechanism 7.

Next, the oxide film removal process executed by the etching apparatus 5 will be described in detail.

In the oxide film removal process, first, the wafer W having an SiO₂ layer (a processing target film) formed thereon is transferred to the etching apparatus 5 and mounted on the mounting table 17. Then, an N₂ gas and an Ar gas are supplied into the chamber 16 from the N₂ gas supply part 33 and the Ar gas supply part 39, respectively. In addition, by the operation of the TMP 19, the internal pressure of the chamber 16 is reduced to and maintained at a predetermined degree of vacuum, which is lower than atmospheric pressure. Furthermore, the temperature of the wafer W is maintained at a constant temperature in a range of 70 to 120 degrees C., for example, 120 degrees C., by the temperature adjuster 42. The wafer W is held on the mounting table 17 at a constant temperature until the oxide film removal process is completed.

Then, a reaction step (hereinafter referred to as "COR step") of reacting a portion of the SiO₂ layer with an NH₃ gas and an HF gas to generate a reaction product (another product). In the COR step, the NH₃ gas is initially supplied from the NH₃ gas supply part 32 into the chamber 16. At this time, the Ar gas is also supplied into the chamber 16, whereas the supply of the N₂ gas is stopped. Conversely, the supply of the Ar gas may be stopped while supplying the N₂ gas, or both the N₂ gas and the Ar gas may be continuously supplied.

Thereafter, while continuing to supply the NH₃ gas into the chamber 16, the supply of the HF gas from the HF gas supply part 38 into the chamber 16 is started. At this time, since the NH₃ gas is supplied in advance into the chamber 16, the internal atmosphere of the chamber 16 becomes an atmosphere of a mixed gas containing the HF gas and the NH₃ gas with the supply of the HF gas. Then, as the SiO₂ layer is exposed to the mixed gas, the SiO₂ layer is modified into a reaction product such as ammonium fluorosilicate ((NH₄)₂SiF₆): ammonium hexa-fluorosilicate) according to the following reaction formula, whereby a reaction product is produced.

$$SiO_2 + 4HF \rightarrow SiF_4 + 2H_2O\uparrow$$

$$SiF_4 + 2NH_3 + 2HF \rightarrow (NH_4)_2SiF_6$$

Subsequently, a sublimation step (hereinafter referred to as "PHT step") (another removal step) of sublimating the reaction product (mainly ammonium fluorosilicate) produced in the COR step and removing the same from the wafer W is executed. In the PHT step, the supply of the HF gas and the NH₃ gas into the chamber 16 is stopped, and the Ar gas or the N₂ gas is supplied. At this time, the temperature of the wafer W is maintained at the same temperature as in the COR step. The reaction product produced in the COR step is sublimated by heat and is discharged from the chamber 16 with the operation of the TMP 19.

That is to say, in the oxide film removal process, the reaction product is produced from the SiO₂ layer through the COR step and the PHT step, and the reaction product thus produced is sublimated to remove the $SiO_2$ layer. The removal amount of the $SiO_2$ layer is controlled mainly based on the supply amounts of the $NH_3$ gas and the HF gas in the COR step.

Incidentally, when the supply of the HF gas into the chamber 16 is started in the COR step, if the HF gas having high reactivity is brought into contact with the $NH_3$ gas or the $SiO_2$ layer, the HF gas immediately undergoes a chemical reaction to generate a reaction product. That is to say, since the HF gas chemically reacts with the $NH_3$ gas or the $SiO_2$ layer before reaching a place to which the HF gas hardly diffuses, for example, the corner of a groove formed on the surface of the wafer W, the $SiO_2$ layer at the corner of the groove is not modified into a reaction product so that the $SiO_2$ layer cannot be sublimated in the subsequent PHT step. Thus, even if the oxide film removal process is performed by the etching apparatus 5, the $SiO_2$ layer remains at the corner of the groove of the wafer W. In the present embodiment, in view of this, the removal process of the $SiO_2$ layer remaining at the corner of the groove is executed after the oxide film removal process is performed by the etching apparatus 5.

FIGS. 3A to 3F are process views for explaining the substrate treatment method according to the present embodiment. The substrate treatment method of FIGS. 3A to 3F is realized as the process controller 43 executes the process recipe called from the memory part 45. Further, the wafer W to which the substrate treatment method of FIGS. 3A to 3F is applied has a structure in which a groove is formed in a predetermined pattern in a polysilicon film 46 formed on the surface of a base portion made of silicon (Si) and an $SiO_2$ layer 47 is formed so as to fill the groove. In the substrate treatment method of FIGS. 3A to 3F, a portion of the $SiO_2$ layer 47 is removed.

Figure 3A:
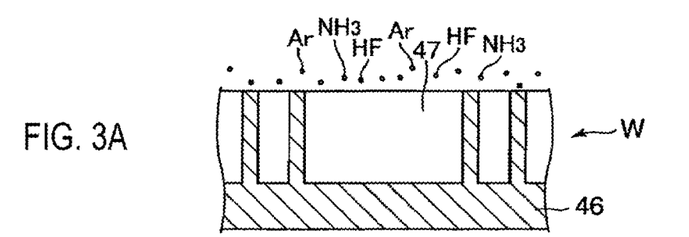
FIGS. 3A to 3F are process views for explaining a substrate treatment method according to an embodiment of the present disclosure.
Figure 3B:
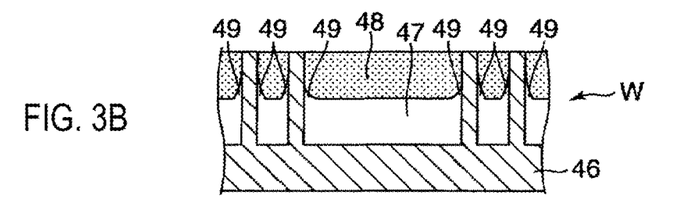

In the substrate treatment method of FIGS. 3A to 3F, an oxide film removal process is initially executed. For example, when the wafer W is transferred to the etching apparatus 5 and mounted on the mounting table 17, a COR step is first executed. That is to say, while maintaining the temperature of the wafer W at a constant temperature in a range of 70 degrees C. to 120 degrees C., for example, 120 degrees C., the internal pressure of the chamber 16 is reduced to a predetermined degree of vacuum lower than atmospheric pressure. After supplying an Ar gas and an $NH_3$ gas into the chamber, an HF gas is supplied (FIG. 3A). At this time, as described above, a portion of the $SiO_2$ layer 47 reacts with the $NH_3$ gas or the HF gas and is modified into ammonium fluorosilicate (hereinafter referred to as "AFS") 48 as a main reaction product (FIG. 3B). On the other hand, the $SiO_2$ layer 49 at the corner of the groove (hereinafter referred to as "corner $SiO_2$ layer") is not modified into to the AFS 48 due to the reason described above. The modification amount of the $SiO_2$ layer 47 is controlled by the supply amounts of the $NH_3$ gas and HF gas.

Subsequently, a PHT step is executed. That is to say, while the temperature of the wafer W is maintained at the same temperature as in the COR step, the supply of the HF gas and the $NH_3$ gas into the chamber 16 is stopped. Thus, the modification of the $SiO_2$ layer 47 into the AFS 48 is stopped. The AFS 48 thus produced is sublimated by heat and is discharged from the chamber 16. As a result, a portion of the $SiO_2$ layer 47 is removed by the oxide film removal process, and the $SiO_2$ layer 47 remaining in the central portion of the groove is flattened. On the other hand, the corner $SiO_2$ layer 49 not modified into the AFS 48 remains without being sublimated.

Figure 3C:
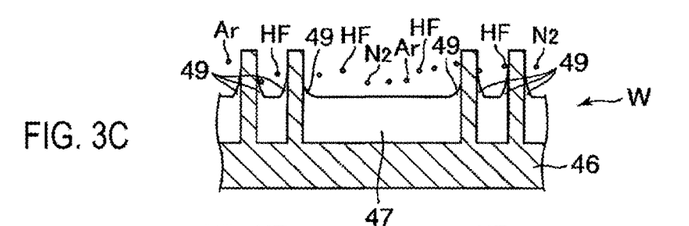
Figure 3D:
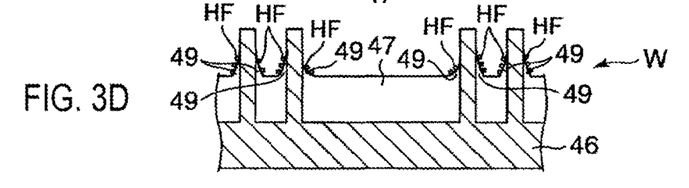

Subsequently, a removal process of the corner $SiO_2$ layer 49 (hereinafter referred to as "corner removal process") (second etching step) is executed. In the removal process of the corner $SiO_2$ layer 49, an ALE (Atomic Layer Etching) process is used in which substantially one layer of molecules of a processing gas is adsorbed onto the surface of a processing target film to remove the processing target film by a chemical reaction. Specifically, while maintaining the temperature of the wafer W at the same temperature as in the oxide film removal process, the AFS 48 which has been modified in the COR step is completely sublimated in the PHT step. Thereafter, first, an $N_2$ gas and an Ar gas are supplied from the $N_2$ gas supply part 33 and the Ar gas supply part 39 into the chamber 16. Then, an HF gas (first processing gas) is supplied from the HF gas supply part 38 into the chamber 16 only for a predetermined period (FIG. 3C). At this time, since no $NH_3$ gas is present inside the chamber 16, the HF gas does not react with the $SiO_2$ layer 47 remaining in the central portion of the groove after the oxide film removal process and the corner $SiO_2$ layer 49, and directly reaches the surface of the $SiO_2$ layer 47 remaining in the central portion of the groove and the surface of the corner $SiO_2$ layer 49, whereby the molecules of the HF gas are adsorbed onto the surface of the corner $SiO_2$ layer 49 and the like (adsorption step) (FIG. 3D).

Subsequently, while continuously supplying the $N_2$ gas and the Ar gas into the chamber 16, the supply of the HF gas is stopped. Furthermore, by positively operating the TMP 19, an excess HF gas not adsorbed onto the surface of the corner $SiO_2$ layer 49 and the like is discharged from the chamber 16 (discharge step).

Figure 4:
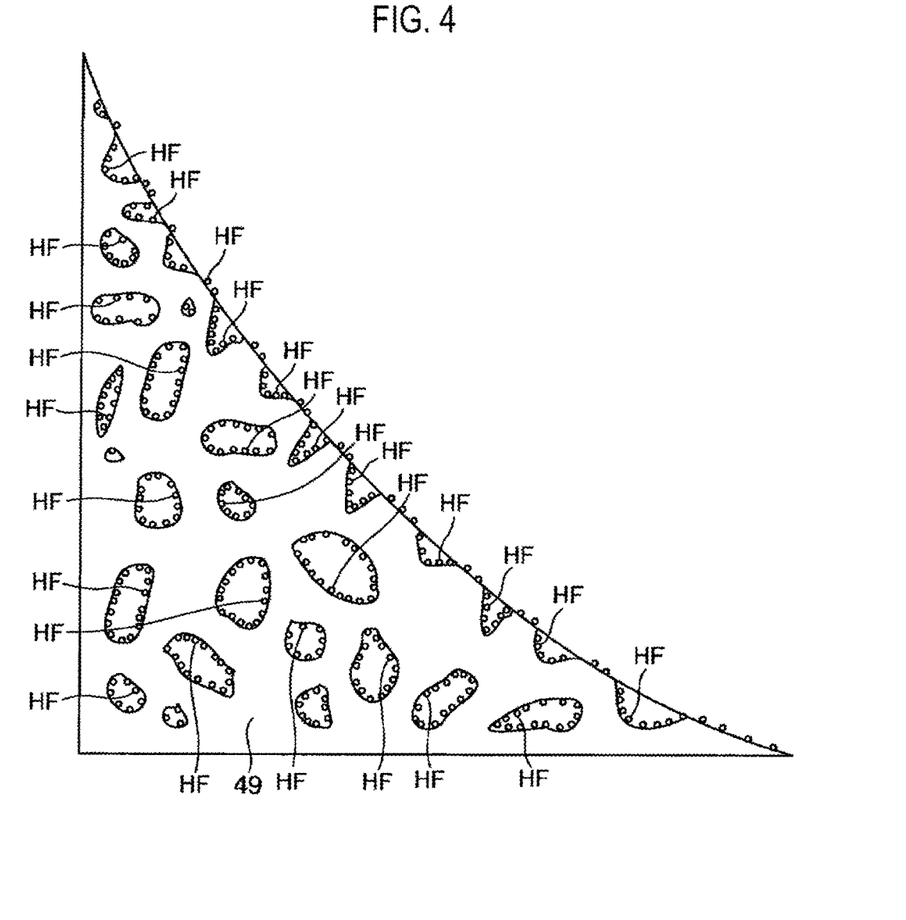
FIG. 4 is an enlarged partial sectional view for explaining how molecules of an HF gas are adsorbed onto surfaces of minute recesses or minute voids of a corner $SiO_2$ layer.

Moreover, in the COR step, the HF gas does not entirely reach the corner $SiO_2$ layer 49, but a trace amount of HF gas may reach the corner $SiO_2$ layer 49. Accordingly, a small fraction of the corner $SiO_2$ layer 49 is modified into a trace amount of AFS 48. In the subsequent PHT step, the trace amount of AFS 48 contained in the corner $SiO_2$ layer 49 is sublimated. As a result, a structure of the corner $SiO_2$ layer 49 becomes more sparse than that of the $SiO_2$ layer 47 remaining in the central portion of the groove after the oxide film removal process. A number of microscopic recesses exist on the surface of the corner $SiO_2$ layer 49, and a number of microscopic voids exist inside the corner $SiO_2$ layer 49. When the molecules of the HF gas are adsorbed onto the corner $SiO_2$ layer 49, as shown in FIG. 4, they are adsorbed onto the microscopic recesses and the microscopic voids of the corner $SiO_2$ layer 49. Thus, the number of molecules of the HF gas adsorbed onto the respective surfaces of the corner $SiO_2$ layer 49 is much larger than the number of molecules of the HF gas adsorbed onto the surface of the $SiO_2$ layer 47 remaining in the central portion of the groove. That is to say, after the excess HF gas is discharged from the chamber 16, the molecules of the HF gas being much larger in number than the molecules of the HF gas adsorbed onto the surface of the $SiO_2$ layer 47 remaining in the central portion of the groove are adsorbed onto the respective surfaces of the corner $SiO_2$ layer 49. In addition, since the excess HF gas is discharged from the chamber 16 as described above, it is possible to prevent the molecules of the HF gas from being excessively adsorbed onto the respective surfaces of the corner $SiO_2$ layer 49. As a result, the respective surfaces of the corner $SiO_2$ layer 49 are covered with substantially one layer of molecules of the HF gas.

Figure 3E:
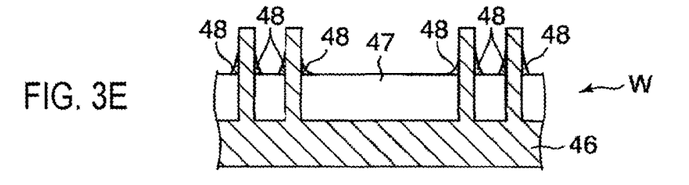

While continuously supplying the $N_2$ gas and the Ar gas into the chamber 16, an $NH_3$ gas (second processing gas) is supplied from the $NH_3$ gas supply part 32 into the chamber 16 only for a predetermined period. The NH₃ gas supplied into the chamber 16 reaches the surface of the SiO₂ layer 47 remaining in the central portion of the groove and the surface of the corner SiO₂ layer 49. However, as described above, the molecules of the HF gas being much larger in number than the molecules of the HF gas adsorbed onto the surface of the SiO₂ layer 47 remaining in the central portion of the groove are adsorbed onto the respective surfaces of the corner SiO₂ layer 49. Therefore, the corner SiO₂ layer 49 reacts with the HF gas and the NH₃ gas more positively than the SiO₂ layer 47 remaining in the central portion of the groove. Thus, the corner SiO₂ layer 49 is substantially modified into AFS 48, whereby the AFS 48 is produced (production step) (FIG. 3 E). On the other hand, since the number of molecules of the HF gas adsorbed onto the surface of the SiO₂ layer 47 remaining in the central portion of the groove is small, the SiO₂ layer 47 remaining in the central portion of the groove is hardly modified into AFS 48.

Figure 3F:
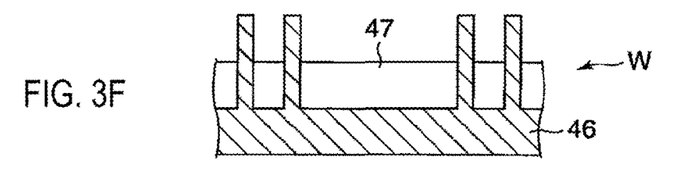

Subsequently, while continuously supplying the N₂ gas and the Ar gas into the chamber 16, the supply of the HF gas is stopped, and the modification of the corner SiO₂ layer 49 into AFS 48 is stopped. At this time, the modified AFS 48 is sublimated by the heat generated from the temperature adjuster 42 of the mounting table 17 and is discharged from the chamber 16. The SiO₂ layer 47 remaining in the central portion of the groove is hardly modified into the AFS 48, whereas the corner SiO₂ layer 49 is substantially modified into AFS 48. As a result, the corner SiO₂ layer 49 is selectively removed (removal step) (FIG. 3F). Thereafter, the present method is terminated.

According to the substrate treatment method of FIGS. 3A to 3F, the molecules of the HF gas are adsorbed onto the corner SiO₂ layer 49 remaining on the wafer W subjected to the oxide film removal process. The NH₃ gas is supplied toward the corner SiO₂ layer 49 onto which the molecules of the HF gas are adsorbed. The corner SiO₂ layer 49 reacts with the HF gas and the NH₃ gas to produce the AFS 48. The AFS 48 is sublimated and removed. Since the structure of the corner SiO₂ layer 49 remaining on the wafer W subjected to the oxide film removal process is sparsely formed by the oxide film removal process, the surface area thereof is increased. Thus, a large amount of molecules of the HF gas are adsorbed onto the corner SiO₂ layer 49. Accordingly, when the NH₃ gas is supplied, the corner SiO₂ layer 49 reacts with the NH₃ gas more positively than the SiO₂ layer 47 remaining in the central portion of the groove. Thus, the corner SiO₂ layer 49 is substantially modified into the AFS 48. As a result, by sublimating the AFS 48, it is possible to selectively remove the corner SiO₂ layer 49 and, ultimately, to obtain a flat SiO₂ layer 47 in the groove.

In general, in order to obtain a flat SiO₂ layer 47 by subjecting the SiO₂ layer 47 formed so as to fill the groove of a predetermined pattern to an oxide film removal process, it is conceivable to shorten the period of executing one COR step as far as possible to reduce a difference in the degree of diffusion of the HF gas, thereby reducing a region where the HF gas hardly reaches. However, in this case, in order to remove a certain amount of the SiO₂ layer 47, it is necessary to repeat, multiple times, the COR step whose period is made as short as possible. Thus, there is a problem that the throughput decreases. On the other hand, in the substrate treatment method of FIGS. 3A to 3F, the SiO₂ layer 47 can be largely removed by one oxide film removal process, and the remaining corner SiO₂ layer 49 can be removed by one corner removal process. It is therefore possible to greatly improve the throughput.

In the substrate treatment method of FIGS. 3A to 3F, after causing the molecules of the HF gas to be adsorbed onto the corner SiO₂ layer 49 and before supplying the NH₃ gas toward the corner SiO₂ layer 49, the excess HF gas is discharged from the chamber 16. This makes it possible to prevent the molecules of the HF gas from being excessively adsorbed onto the SiO₂ layer 47 remaining in the central portion of the groove. Consequently, it is possible to prevent the SiO₂ layer 47 remaining in the central portion of the groove from being modified to the AFS 48 and being removed more than necessary and to prevent the shape of the corner SiO₂ layer 49 from collapsing. In addition, it is possible to prevent the molecules of the HF gas from being excessively adsorbed onto the respective surfaces of the corner SiO₂ layer 49. The respective surfaces of the corner SiO₂ layer 49 are covered with substantially one layer of molecules of the HF gas. Accordingly, when microscopically observing the respective surfaces of the corner SiO₂ layer 49, a trace amount of AFS 48 is produced on the respective surfaces of the corner SiO₂ layer 49. As a result, the time period required for sublimation of the AFS 48 can be extremely shortened by a so-called size effect, which makes it possible to further improve the throughput. The size effect referred to herein is an effect by which the properties (physical properties) of a substance is changed as the size of the substance is made smaller to a specific size. For example, the size effect is known as an effect that, despite the normal melting point of gold (Au) being 1064 degrees C., the melting point of gold particles having a diameter of 2.4 nm is reduced to near 100 degrees C. The factor of the size effect is that the smaller the size of the particles constituting a substance, the larger the ratio of the surface areas of atoms and molecules in a single particle, whereby a portion influenced by an external action and the like becomes larger.

In the substrate treatment method of FIGS. 3A to 3F, the type of the gas used in the corner removal process is the same as the type of the gas used in the oxide film removal process. Therefore, any of the processes can be executed by the etching apparatus 5. This also makes it possible to further improve the throughput. In the case where the oxide film removal process and the corner removal process are executed by the same etching apparatus 5, it is not necessary to increase the type of the gas supply system of the etching apparatus 5, which makes it possible to prevent the configuration of the etching apparatus 5 from becoming complicated.

In the above-described corner removal process of the substrate treatment method of FIGS. 3A to 3F, the N₂ gas and the Ar gas are supplied into the chamber 16 in any of the adsorption step, the discharge step, the production step, and the removal step. In any of the steps, only one of the N₂ gas and the Ar gas may be supplied into the chamber 16.

Furthermore, in the above-described corner removal process of the substrate treatment method of FIGS. 3A to 3F, the HF gas is supplied into the chamber 16 in the adsorption step, and then the excess HF gas is discharged from the chamber 16 in the discharge step. Further, the NH₃ gas is supplied into the chamber 16 in the production step. However, the supply order of the gases is not limited to the above order. For example, first, in the adsorption step, the NH₃ gas may supplied into the chamber 16 so as to be adsorbed onto the surface of the corner SiO₂ layer 49 or the like. Thereafter, in the discharge step, the excess NH₃ gas may be discharged from the chamber 16. Furthermore, in the production step, the HF gas may be supplied into the chamber 16 to modify the corner SiO₂ layer 49 into the AFS 48.

FIGS. 5A to 5F are process views for explaining a modification of the substrate treatment method according to the present embodiment. The substrate treatment method of FIGS. 5A to 5F is also realized by the process controller 43 executing the process recipe called from the memory part 45. The wafer W subjected to the substrate treatment method of FIGS. 5A to 5F has a structure in which a pair of wall portions 51 of silicon nitride (SiN) are formed on a surface of a base portion 50 made of Si, a gate oxide film 52 is formed in a bottom portion of a groove defined by the wall portions 51, and an upper side of the gate oxide film 52 is covered with a polysilicon film 53 inside the groove. In the substrate treatment method of FIGS. 5A to 5F, the polysilicon film 53 is entirely removed. The substrate treatment apparatus of FIGS. 5A to 5F is also performed by the etching apparatus 5. However, the substrate treatment apparatus of FIGS. 5A to 5F is different in the type of gas to be used from the substrate treatment method of FIGS. 3A to 3F.

Figure 5A:
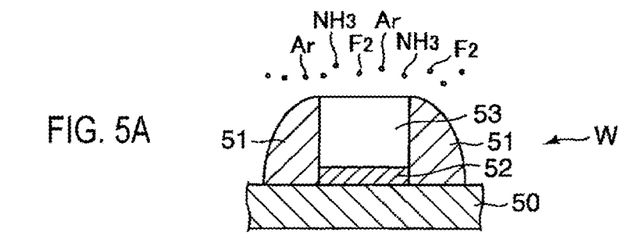
FIGS. 5A to 5F are process views for explaining a modification of the substrate treatment method according to an embodiment of the present disclosure.
Figure 5B:
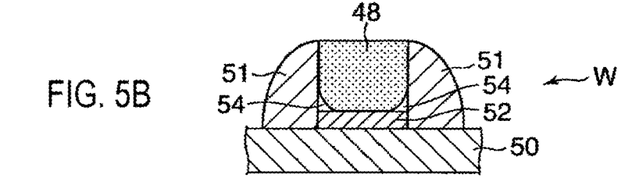

In the substrate treatment method of FIGS. 5A to 5F, a polysilicon film removal process (first etching step) is initially performed. For example, if the wafer W is transferred to the etching apparatus 5 and mounted on the mounting table 17, first, a COR step is executed. Specifically, while maintaining the temperature of the wafer W at a constant temperature in a range of 70 degrees C. to 120 degrees C., the internal pressure of the chamber 16 is reduced to a predetermined degree of vacuum lower than atmospheric pressure. After supplying an Ar gas and an $NH_3$ gas into the chamber 16, an $F_2$ gas is supplied (FIG. 5A). At this time, the polysilicon film 53 reacts with the $NH_3$ gas or the $F_2$ gas and is modified into an AFS 48 (FIG. 5B). Similar to the HF gas, the $F_2$ gas has high reactivity. Thus, the $F_2$ gas chemically reacts with the $NH_3$ gas or the polysilicon film 53 before reaching a place where the gas hardly diffuses, for example, a corner of the groove defined by the wall portions 51. Therefore, the polysilicon film (hereinafter referred to as "corner polysilicon film") 54 existing at the corner of the groove is not modified into the AFS 48.

Subsequently, a PHT step is executed. Specifically, the supply of the $F_2$ gas and the $NH_3$ gas into the chamber 16 is stopped while keeping the temperature of the wafer W at the same temperature as in the COR step. Thus, the modification of the polysilicon film 53 into the AFS 48 is stopped. The produced AFS 48 is sublimated by heat and is discharged from the chamber 16. As a result, most of the polysilicon film 53 is removed by the polysilicon film removal process, but the corner polysilicon film 54 not modified into the AFS 48 remains without being sublimated.

Figure 5C:
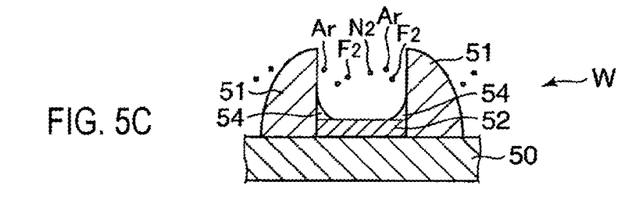
Figure 5D:
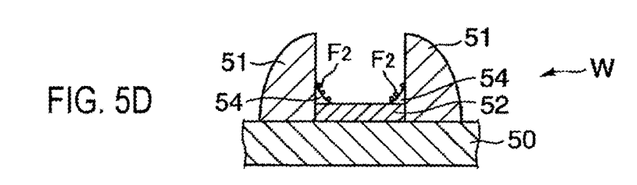

Subsequently, a removal process (second etching step) of the corner polysilicon film 54 is executed. An ALE step is also used in the removal process of the corner polysilicon film 54. Specifically, while maintaining the temperature of the wafer W at the same temperature as in the polysilicon film removal process, the AFS 48 modified in the COR step is completely sublimated in the PHT step. Thereafter, an $N_2$ gas and an Ar gas are first supplied into the chamber 16, and an $F_2$ gas (first processing gas) is supplied into the chamber 16 only for a predetermined period (FIG. 5C). At this time, since no $NH_3$ gas is present in the chamber 16, the $F_2$ gas reaches the surface of the corner polysilicon film 54 without reacting with the remaining corner polysilicon film 54. The molecules of the $F_2$ gas are adsorbed onto the surface of the corner polysilicon film 54 (adsorption step) (FIG. 5D).

Subsequently, while continuously supplying the $N_2$ gas and the Ar gas into the chamber 16, the supply of the $F_2$ gas is stopped. Furthermore, by positively operating the TMP 19, the excess $F_2$ gas not adsorbed onto the surface of the corner polysilicon film 54 or the like is discharged from the chamber 16 (discharge step).

Incidentally, in the substrate treatment method of FIGS. 5A to 5F, similar to the substrate treatment method of FIGS. 3A to 3F, in the COR step, the $F_2$ gas does not entirely reach the corner polysilicon film 54, but a trace amount of $F_2$ gas may reach the corner polysilicon film 54. Therefore, a small fraction of the corner polysilicon film 54 is modified into a small amount of AFS 48. In the subsequent PHT step, the trace amount of AFS 48 contained in the corner polysilicon film 54 is sublimated. As a result, the structure of the corner polysilicon film 54 becomes sparse. Similar to the corner $SiO_2$ layer 49, a number of microscopic recesses are present on the surface of the corner polysilicon film 54, and a number of microscopic voids are present inside the corner polysilicon film 54. When the molecules of the $F_2$ gas are adsorbed onto the corner polysilicon film 54, the molecules of the $F_2$ gas are adsorbed onto the surfaces of the microscopic recesses and the microscopic voids of the corner polysilicon film. Thus, the number of the molecules of the $F_2$ gas adsorbed onto the respective surfaces of the corner polysilicon film 54 becomes very large. Furthermore, since the excess $F_2$ gas is discharged from the chamber 16 as described above, it is possible to prevent the molecules of the $F_2$ gas from being excessively adsorbed onto the respective surfaces of the corner polysilicon film 54. As a result, the respective surfaces of the corner polysilicon film 54 are covered with substantially one layer of the molecules of the $F_2$ gas.

Figure 5E:
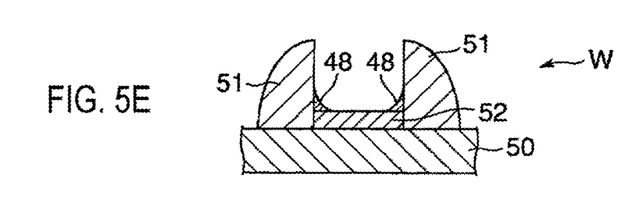

Then, while continuously supplying the $N_2$ gas and the Ar gas into the chamber 16, an $NH_3$ gas (second processing gas) is supplied into the chamber 16 only for a predetermined period. The $NH_3$ gas supplied into the chamber 16 reaches the surface of the corner polysilicon film 54. However, since a very large number of $F_2$ gas molecules are adsorbed onto the respective surfaces of the corner polysilicon film 54 as described above, the corner polysilicon film 54 positively reacts with the $F_2$ gas or the $NH_3$ gas. Thus, the corner polysilicon film 54 is substantially modified into the AFS 48, whereby the AFS 48 is produced (production step) (FIG. 5E).

Figure 5F:
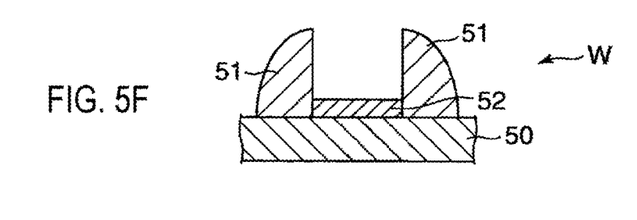

Subsequently, while continuously supplying the $N_2$ gas and the Ar gas into the chamber 16, the supply of the $F_2$ gas is stopped, and the modification of the corner polysilicon film 54 into the AFS 48 is stopped. At this time, the modified AFS 48 is sublimated by the heat generated from the temperature adjuster 42 of the mounting table 17 and is discharged from the chamber 16. Since the corner polysilicon film 54 is substantially modified into the AFS 48, the corner polysilicon film 54 can be selectively removed (removal step) (FIG. 5F). As a result, it is possible to completely remove the polysilicon film 53 from the groove defined by the wall portions 51. Consequently, the gate oxide film 52 can be exposed in the bottom portion of the groove. Thereafter, the present method is terminated.

In the above-described corner removal process according to the modification of the substrate treatment method of FIGS. 5A to 5F, the $F_2$ gas is supplied into the chamber 16 in the adsorption step. Thereafter, the excess $F_2$ gas is discharged from the chamber 16 in the discharge step. Furthermore, the $NH_3$ gas is supplied into the chamber 16 in the production step. However, the supply order of the gases is not limited to the above order. For example, first, in the adsorption step, the $NH_3$ gas may be supplied into the chamber 16 and may be adsorbed onto the surface of the corner polysilicon film 54 or the like. Thereafter, in the discharge step, the excess $NH_3$ gas may be discharged from the chamber 16. Furthermore, in the production step, the corner polysilicon film 54 may be modified into the AFS 48 by supplying the $F_2$ gas into the chamber 16.

While the embodiment of the present disclosure has been described above, the present disclosure is not limited to the above-described embodiments. For example, in the substrate treatment methods of FIGS. 3A to 3F and FIGS. 5A to 5F, the COR step, the PHT step and the ALE step are executed once. However, the number of executions of each step is not limited to one. Specifically, when the COR step and the PHT step are repeated a plurality of times, a combination of the COR step, the PHT step and a CST (Cooling Storage) step of cooling the wafer W may be repeatedly performed a plurality of times. Thereafter, the ALE step may be executed once, the ALE step and the PHT step may be executed once, or the COR step, the ALE step and the PHT step may be executed once. When the AFS 48 is hardly produced in the COR step, in the substrate treatment method, the COR step and the ALE step may be merely performed once while omitting the PHT step, or the COR step and the ALE step may be executed once and then the PHT step may be executed only once.

Further, in the substrate treatment methods of FIGS. 3A to 3F and FIGS. 5A to 5F, the etching (the COR step or the PHT step) mainly performed through a chemical reaction is used in the first etching step. In the first etching process, a dry etching may be used as the etching. For example, a plasma etching may be used.

Furthermore, in the substrate treatment methods of FIGS. 3A to 3F and FIGS. 5A to 5F, the ALE step is used to remove the layer (the corner $SiO_2$ layer 49 or the corner polysilicon film 54) made of $SiO_2$ or silicon and remaining at the corner of the groove. Similarly, the ALE step may be used to remove a layer made of SiN and remaining at the corner of the groove. Even in this case, it is possible to selectively remove the layer made of SiN and remaining at the corner of the groove.

Further, an embodiment of the present disclosure may include a storage medium that stores program codes of software for realizing the functions of the above-described embodiments to the process controller 43, and allowing the process controller 43 to read and execute the program codes stored in the storage medium.

In this case, the program codes read from the storage medium realizes the functions of the above-described embodiments. The program codes and the storage medium that stores the program codes constitute the present disclosure.

EXAMPLES

Next, examples of the present disclosure will be described.

Figure 6A:
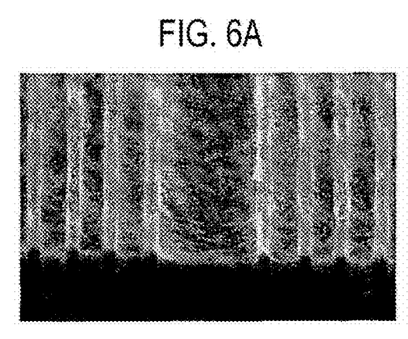
FIG. 6A is an SEM photograph of the surface of a wafer in a Comparative example of the present disclosure.

First, a test wafer W having a structure in which an $SiO_2$ layer 47 is formed so as to fill a groove of a predetermined pattern of a polysilicon film 46 that is formed on q surface of a base portion made of silicon was prepared as a Comparative example. The test wafer W was transferred to the etching apparatus 5. In the etching apparatus 5, the wafer W was subjected to the oxide film removal process of the substrate treatment method of FIGS. 3A to 3F. Thereafter, the wafer W was taken out from the substrate processing system 1. The surface of the wafer W was checked by SEM (FIG. 6A).

Figure 6B:
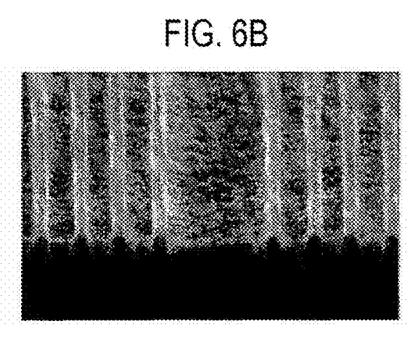
FIG. 6B is an SEM photograph of the surface of a wafer in an Example 1 of the present disclosure.

Subsequently, the same wafer W as in Comparative example 1 was prepared as Example 1. In the etching apparatus 5, the wafer W was subjected to the oxide film removal process and the corner removal process of the substrate treatment method of FIGS. 3A to 3F. The wafer W was taken out from the substrate processing system 1. The surface of the wafer W was checked by SEM (FIG. 6B). In the corner removal process of Example 1, the temperature of the wafer W was maintained at 100 degrees C. by the temperature adjuster 42 of the mounting table 17.

Figure 6C:
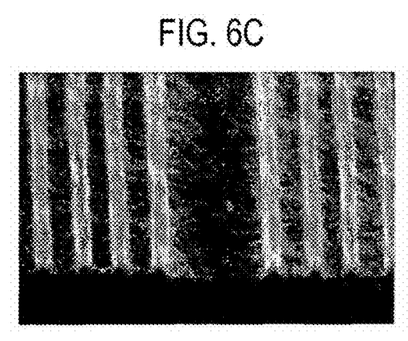
FIG. 6C is an SEM photograph of the surface of a wafer in an Example 2 of the present disclosure.

Subsequently, the same wafer W as in Comparative example 1 was prepared as Example 2. In the etching apparatus 5, the wafer W was subjected to the oxide film removal process and the corner removal process of the substrate treatment method of FIGS. 3A to 3F. The wafer W was taken out from the substrate processing system 1. The surface of the wafer W was checked by SEM (FIG. 6C). In the corner removal process of Example 2, the temperature of the wafer W was maintained at 80 degrees C.

Figure 6D:
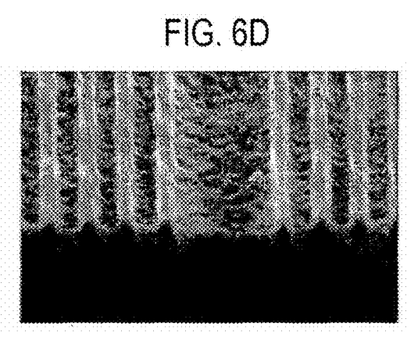
FIG. 6D is an SEM photograph of the surface of a wafer in an Example 3 of the present disclosure.

Subsequently, the same wafer W as in Comparative example 1 was prepared as Example 3. In the etching apparatus 5, the wafer W was subjected to the oxide film removal process and the corner removal process of the substrate treatment method of FIGS. 3A to 3F. The wafer W was taken out from the substrate processing system 1. The surface of the wafer W was checked by SEM (FIG. 6D). In the corner removal process of Example 3, the temperature of the wafer W was maintained at 60 degrees C.

From the checking results of SEM of Comparative example 1 and Examples 1 to 3, it was confirmed that the corner $SiO_2$ layer 49 was not removed in Comparative example 1, whereas the corner $SiO_2$ layer 49 was removed in Examples 1 and 2. In particular, it was confirmed that the corner $SiO_2$ layer 49 hardly remains in Example 2. Accordingly, it was found that the corner removal process utilizing the ALE step to remove the corner $SiO_2$ layer 49 is very effective.

In addition, as described above, it was confirmed that the corner $SiO_2$ layer 49 is removed in Examples 1 and 2. In Example 3, it was confirmed that the AFS 48 remains in the corner portion. This is presumably because the temperature of the wafer W in the corner removal process of Example 3 is at a low level of 60 degrees C., and the AFS 48 modified from the corner $SiO_2$ layer 49 is not sufficiently sublimated in the corner removal process.

From the foregoing, it was found that, in the corner removal process using the ALE step, in order to remove the corner $SiO_2$ layer 49, the temperature of the wafer W may be maintained at a temperature ranging from 70 degrees C. and 120 degrees C., specifically at a temperature ranging from 80 degrees C. to 100 degrees C., more specifically at a temperature close to 100 degrees C.

This application claims priority based on Japanese Patent Application No. 2015-217701 filed on Nov. 5, 2015, the entire contents of which are incorporated herein by reference.

EXPLANATION OF REFERENCE NUMERALS

W: wafer, 1: substrate processing system, 5: etching apparatus, 17: mounting table, 16: chamber, 42: temperature adjuster, 43: process controller, 47: $SiO_2$ layer, 48: AFS, 49: corner $SiO_2$ layer, 53: polysilicon film, 54: corner polysilicon film, 55: SiN layer, 56: corner SiN layer

What is claimed is:
1. A substrate treatment method for flattening a surface of a substrate by at least partially removing a processing target film formed on the surface of the substrate, comprising:

a first etching step of subjecting the processing target film to a first etching; and a second etching step of subjecting the processing target film subjected to the first etching to a second etching, wherein the first etching step includes:

a supplying step of supplying a first processing gas toward the processing target film;

a supplying step of supplying a second processing gas toward the processing target film while the first processing gas is being supplied;

a production step of producing a first product by allowing the processing target film, the first processing gas and the second processing gas to react each other; and a first removal step of sublimating and removing the first product, wherein the second etching step includes:

an adsorption step of causing molecules of the second processing gas to be adsorbed onto the processing target film subjected to the first etching;

a production step of producing a second product by supplying the first processing gas toward the processing target film onto which the molecules of the second processing gas are adsorbed, and allowing the processing target film, the first processing gas and the second processing gas to react with each other; and a second removal step of sublimating and removing the second product, wherein the processing target film is formed inside a groove formed on the surface of the substrate, and wherein the second etching step further includes a discharge step of discharging an excess gas of the second processing gas between the adsorption step and the production step.

2. The method of claim 1, wherein after repeatedly executing the first etching step a plurality of times, the second etching step is executed.

3. The method of claim 1, wherein the first processing gas is a halogen-based gas, the second processing gas is a base-based gas, and the processing target film is a silicon-based film.

4. The method of claim 1, wherein the first processing gas is a base-based gas, the second processing gas is a halogen-based gas, and the processing target film is a silicon-based film.

5. The method of claim 1, wherein in the second etching step, a temperature of the substrate is maintained at a temperature ranging from 70 degrees C. to 120 degrees C.

* * * * *